United States Patent [19]

Sugimoto et al.

[11] Patent Number: 4,885,273

[45] Date of Patent: Dec. 5, 1989

[54] METHOD OF PRODUCING A SUPERCONDUCTING WIRE USING ALLOY PREFORM

[75] Inventors: Mamoru Sugimoto; Osamu Kohno; Yoshimitsu Ikeno; Nobuyuki Sadakata; Shin'ya Aoki; Mikio Nakagawa, all of Tokyo, Japan

[73] Assignee: Fujikura Ltd., Tokyo, Japan

[21] Appl. No.: 170,019

[22] Filed: Mar. 18, 1988

[30] Foreign Application Priority Data

| Mar. 20, 1987 | [JP] | Japan | 62-67103 |
| Mar. 20, 1987 | [JP] | Japan | 62-67113 |
| Mar. 20, 1987 | [JP] | Japan | 62-67105 |
| Mar. 20, 1987 | [JP] | Japan | 62-67104 |
| May 26, 1987 | [JP] | Japan | 62-128852 |
| Jun. 8, 1987 | [JP] | Japan | 62-142453 |
| Aug. 14, 1987 | [JP] | Japan | 62-202835 |
| Sep. 3, 1987 | [JP] | Japan | 62-220909 |
| Sep. 22, 1987 | [JP] | Japan | 62-237952 |

[51] Int. Cl.$^4$ .................. B05D 5/12; H01L 39/24
[52] U.S. Cl. ............................ 505/1; 29/599; 427/62
[58] Field of Search ................. 505/1; 29/599; 427/62

[56] References Cited

PUBLICATIONS

Kumakura et al., *Jap. J. of Appl. Phys.*, vol. 26, No. 7, Jul. 1987, pp. 1172–1173.

*Primary Examiner*—Norman Morgenstern
*Assistant Examiner*—Margaret Bueker
*Attorney, Agent, or Firm*—Oblon, Spivak, McClelland, Maier & Neustadt

[57] ABSTRACT

A method of producing a superconducting wire including A-B-C-D system oxide superconductor wherein A is an at least one element of group IIIa of the Periodic Table, B is an at least one alkali earth metal, C includes Cu and D includes O. In the method, a material containing at least one of both A and B is arranged inside or outside an elongated tubular coating layer, which includes a copper alloy and at least the other one, to form a composite element. Then, the composite element undergoes a heat treatment to produce the superconductor.

9 Claims, 6 Drawing Sheets

FIG. 7
FIG. 8
FIG. 9
FIG. 10
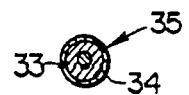
FIG. 11
FIG. 12
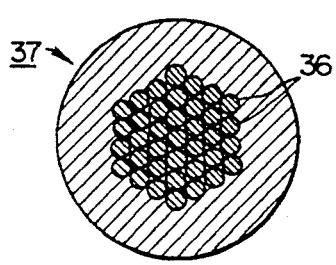

METHOD OF PRODUCING A SUPERCONDUCTING WIRE USING ALLOY PREFORM

The present invention relates, though not exclusively, to a method of producing a superconducting wire which may be used in, for example, magnets for nuclear magnetic resonance or for particle acceleration and a superconducting wire produced according to the method.

Recently, various oxide superconductors which exhibit very high critical temperatures (Tc) have been increasingly discovered. For producing such superconductors, for example, (La,Sr)CuO superconductor, a mixture of powders of a carbonate of Sr, an oxide of La and CuO is subjected to a heat treatment.

However, the carbonate of Sr and the oxide of La are extremely hard to be worked and hence it is difficult to fabricate a long superconducting wire by extrusion or drawing without any trouble such as breaking.

Accordingly, it is an object of the present invention to provide a method of producing a composite oxide superconductor which method reduces the above disadvantage of the prior art.

It is another object of the present invention to provide a composite oxide superconductor produced according to the method.

According to one aspect of the present invention, there is provided a method of producing a superconducting wire including A-B-C-D system oxide superconductor wherein A is an at least one element of group IIIa of the Periodic Table, B is an at least one alkali earth metal, C includes Cu and D includes O. In the method, a material containing at least one of both A and B is arranged inside or outside an elongated tubular coating layer, which includes a copper alloy and at least the other one, to form a composite element. Then, the composite element undergoes a heat treatment to produce the superconductor.

Another aspect of the present invention is directed to a superconducting wire produced by the method.

In the superconducting wire according to the present invention, a superconducting layer is formed in the interface between the tubular coating layer and the material, containing at least one of both the A and the B, and hence excellent adhesion of the superconducting layer to the coating layer is obtained. Further, the superconducting layer has a uniform thickness.

The tubular coating layer may reinforce the superconducting layer. The thickness of the superconducting layer may be controlled by adjusting the content of each of the A and B.

The IIa group element may include Be, Sr, Mg, Ca, Ba and Ra.

The IIIa group element may include Sc, Y, La, Ce, Pr, Nd, Pm, Sm, Eu, Gd, Tb, Dy, Ho, Er, Tm, Yb and Lu.

The component A may include more than two IIIa group elements above named while the component B may include more than two IIa group elements above named. When two elements are used for either A or B, for example, La-Yb-Ba-Cu-O or Y-Ba-Sr-Cu-O system superconductor is produced.

In the drawings:

FIGS. 7 to 11 illustrate in diagrammatic cross-sectional views how to fabricate another La-Sr-Cu-O system superconductor according to the present invention;

FIG. 12 is a diagrammatic cross-sectional view of a multi-strand superconducting wire using superconducting strands in FIG. 11;

FIGS. 1 to 4 illustrate an embodiment of the present invention which is applied to production of a superconducting wire of (La,Sr)CuO system.

Figure 1:
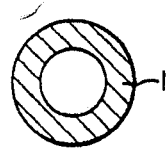
FIGS. 1 to 4 are diagrammatic cross-sectional views illustrating one embodiment of the present invention.

As the first step of a process for producing this type of superconducting wire, a tube 1 as shown in FIG. 1 is prepared from a Cu-Sr alloy. The tube 1 preferably contains about 5 to about 30 weight % of Sr. With the lower limit of about 5%, the tube 1 is provided with an appropriate hardness for diameter reduction. Further, the upper limit is preferable for ease in diameter reduction.

Then, a powder mixture is formed by mixing a powder of a Cu-La alloy and a powder of CuO so that the following conditions are met:

Cu: (La, Sr) = 1:1 (mol ratio)

La: Sr = (1−x): x $0.1 \leq x \leq 0.9$ (mol ratio)

where, the Sr indicates that in the Cu-Sr alloy of the tube.

Figure 2:
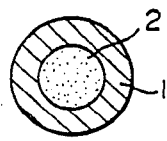
Figure 3:

The thus obtained powder mixture 2 is charged in the tube 1 as shown in FIG. 2 to form a preform composite, which is then subjected to extrusion and/or drawing to obtain a composite wire 3, shown in FIG. 3, of a desired diameter. The tube 1 containing the powder mixture has excellent workability, so that it is possible to draw it and form the continuous wire 3 of a considerable length without any breaking.

The wire 3 is then subjected to a heat treatment which includes 1 to 100-hour heating at a temperture between 800° and 1100° C., so that La and Sr in the composite wire 3 are diffused around the CuO particles and are made to react therewith, whereby a superconducting wire 4 of (La ,Sr) CuO system is obtained.

The described process may be modified so that the tube 1 is prepared from a Cu-La alloy, while the powder mixture charged in the tube 1 contains a Cu-Sr alloy powder and CuO powder.

It is also possible to use a powder of La oxide in place of the Cu-La alloy powder. In such a case, the La oxide powder and the Cu-O powder are mixed to form a powder mixture 2 so as to meet the following conditions:

Sr:La=2:3

(Sr:La):Cu=1:1 (atomic ratio or mole ratio)

The thus obtained powder mixture is charged in the tube 1, and the superconducting wire 4 is obtained through same process as that explained before.

It is also possible to use a La powder in place of the La oxide powder in this process.

Figure 4:

This process also can be modified so that powder of an Sr compound or Sr powder is charged in the tube 1 made of a Cu-La alloy and the same procedures are followed as those of the above-described embodiment in FIGS. 3 and 4, so as to produce a superconducting wire.

In fabricating an Y-Ba-Cu-O superconducting composite wire according to the present invention, an ingot of Cu-Y alloy may be made by arc melting or high-frequency induction heating. Then, a tube as shown in FIG. 1 is prepared from the ingot by boring or a suitable plastic work. A powder of BaO is then charged into the tube as shown in FIG. 2. Subsequently, the preform composite undergoes extrusion and/or drawing for diameter reduction to form a composite wire as shown in FIG. 3. During this processing, the tube exhibits good workability, so that a long continuous wire can be obtained without any trouble such as breaking.

The wire is then subjected to a heat treatment which includes 1 to 300-hour heating at 700° to 1300° C. so that Y, Ba, Cu and O are made to react to form a superconducting substance of Y-Ba-Cu-O system, whereby a superconducting wire having a superconductor in it is obtained as shown in FIG. 4.

The modified superconducting wire is a long continuous wire having a high critical temperature of 90 K or so and exhibits excellent superconductivity.

In the described embodiment and modification, the portion of the finished wire where the superconducting substance is not formed, i.e., the portion outside the superconductor 4a, is constituted by a copper alloy which is workable, so that the finished wire may be wound into a coil.

Figure 5:
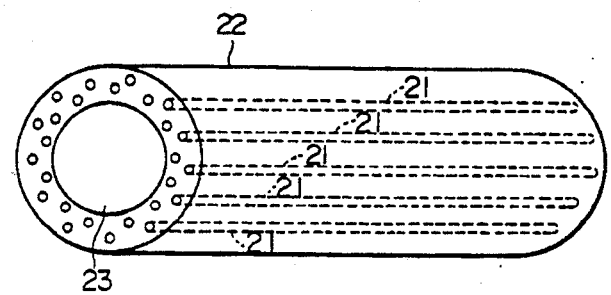
FIG. 5 is a diagrammatic illustration of another composite element to which the present invention is applied.

FIG. 5 shows another modified process of the present invention. As the first step of this process, a bar-shaped Cu-Y ingot alloy, with uniform orientation of the Cu-Y intermetallic compound phases 21 is prepared through conventional uni-axial solidification method or like. The Cu-Y ingot is then subjected to machining such as surface grinding and boring, whereby a Cu-Y alloy tube 22 is obtained. The Cu-Y alloy tube 22 preferably contains about 5 to about 30% by weight of Y for the same reasons as the Cu-Sr alloy tube 1, i.e., for diameter reduction. Thereafter, a powder 23 of an oxide of a Cu-Ba alloy is charged into the Cu-Y alloy tube 22, thus obtaining a bar-shaped member as shown in FIG. 5. This bar-shaped member is then subjected to diameter reduction such as extrusion and drawing, followed by substantially the same heat treatment as in the preceding modification, whereby a superconducting wire is obtained. Though in the modified form in FIG. 5, the Cu-Y alloy tube 22 is charged with the powder 23 of Cu-Ba alloy oxide, the Cu-Ba alloy oxide powder may be substituted by other suitable material such as a powder of a Cu-Ba alloy fluoride, powder of Cu-Ba alloy chloride, a mixture of these powders and mixture of one of these powders and the Cu-Ba alloy oxide powder. When the Cu-Ba alloy oxide powder is not used, the heat treatment is preferably conducted in an atmosphere containing oxygen.

Figure 6:
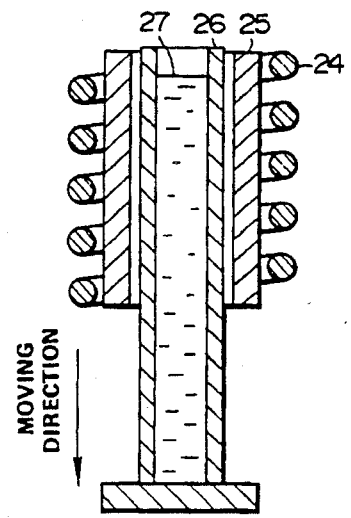
FIG. 6 is a diagrammatic axial cross-section of an apparatus for producing a Cu-Y alloy ingot used for the composite element.

FIG. 6 shows a known apparatus for producing the above-mentioned Cu-Y alloy ingot by uni-axial solidification.

The apparatus has a high-frequency induction coil 24, a cylindrical graphite liner 25, cylindrical crucible 26 made of CaO disposed in the graphite liner, and a lifting means (not shown) for moving the crucible 26 up and down within the graphite liner 25. When the Cu-Y alloy ingot is produced by this apparatus, a melt 27 of a Cu-Y alloy is charged in the crucible 26 and the melt 27 is heated by the high-frequency induction heating coil 24. Subsequently, the crucible in the heated state is lowered at a predetermined speed. As a result, the melt 27 in the crucible 26 is progressively cooled from the lower end towards the upper end thereof, whereby a bar-shaped Cu-Y alloy ingot is formed. During the solidification, a plurality of acicular Cu-Y intermetallic compound phases 21 are formed in a uniform orientation in the axial direction of the Cu-Y alloy ingot.

Thus, the described process includes the steps of preparing a tube 22 of a Cu-Y alloy having a structure with a multiplicity of Cu-Y intermetallic compound phases 21 oriented uniformly in the axial direction of the tube 22, charging the tube 22 with powder 23 of the Cu-Ba alloy oxide, subjecting the tube with the powder 23 therein to a mechanical processing to reduce its diameter, and effecting a heat treatment on the tube of the reduced diameter. In this process, the Ba element of the Cu-Ba alloy oxide powder 23 is diffused so as to react with the Cu-Y intermetallic compound phases 21 in the Cu-Y alloy tube 22, whereby a superconductor wire is obtained in which a multiplicity of very long and thin oxide superconductors having a uniform crystalline structure are formed along the Cu-Y intermetallic compound phases 21 continuously over the entire length of the superconductor wire. It is therefore possible to obtain a fairly long superconducting wire having excellent superconductivity. In addition, oxide superconductors which are very brittle are formed in acicular form in the axial direction of the superconductor wire, so that bending strength of the superconducting wire is improved appreciably. It is also to be noted that the matrix of Cu-Y alloy surrounding the oxide superconductors effectively serves as a reinforcement for reinforcing the superconductors, whereby a high mechanical strength of the superconductor wire is ensured.

Although a superconductor wire of Y-Ba-Cu-O system has been described specifically, it is to be understood that similar superconducting wires can be produced by using, in place of Y of the above-mentioned system, one of the elements belonging to group IIIa of the periodic table such as La, Sc, Yb, Dy, Ho and Er. It is also possible to produce similar superconducting wires by using, in place of Ba, one of elements of the group IIa of the periodic table, e.g., Sr.

In the method in FIG. 5, the power of the oxide of the powder of a compound of an alloy, including copper and an element of group IIa of the periodic table, is charged in the tube which is made of an alloy of copper and an element of the group IIIa of the periodic table. This, however, is not exclusive and the method may be modified so that a tube of an alloy of copper and an element of the group IIa of the periodic table is charged with a powder of an oxide of an alloy of copper and an element of group IIIa of the periodic table.

FIGS. 7 to 11 illustrate another embodiment applied to the production of a superconducting wire of (La, Sr) CuO system. The production process employs a copper tube 31 with finely dispersed CuO particles, the copper tube 31 being prepared by a suitable known method.

Then, an La rod 32 of a circular cross-section is inserted into the copper tube 31 to form a preform, which is then subjected to extrusion and/or drawing into a composite wire shown in FIG. 9. The extrusion and drawing can be easily carried out by virtue of good workability exhibited by both the copper tube 31 and the rod 32.

Then, a coating layer 34 of Sr is formed over the external surface of the wire 33, thus forming a coated wire 35. The formation of the coating layer of Sr over the wire 33 may be conducted by any known method such as plating, cladding and vapor deposition.

Subsequently, the coated wire 35 is subjected to a heat treatment which includes 1 to 100-hour heating at 800° to 1100° C., so that the fine CuO particles dispersed in the copper tube 31, La in the tube 32 and Sr outside the tube 31 are made to react with one another, thus forming a superconducting wire 36 of (La, Sr) CuO system.

The amounts of CuO dispersed in the copper tube 31, La in the rod 32 and Sr in the coating layer 34 may be the same as those in the embodiment described in connection with FIGS. 1 to 4.

The embodiment shown in FIGS. 7 to 11 may be modified so that a rod of Sr is inserted into the copper tube 31 which is coated with a layer of La. The CuO particles dispersed in the copper tube 31 may be substituted by other copper oxide such as $Cu_2O$, $Cu_2O_3$ and $Cu_4O$. It is also possible to use a copper alloy tube, such as Cu-La, Cu-La-Sr and Cu-Sr alloy tube, in place of the copper tube 31.

It will be clear to those skilled in the art that a plurality of superconducting wires of the invention are bundled and cladded with a metal sheath to form a fine multi-core superconducting wire 37 as illustrated in FIG. 12 although the superconducting wires of the preceding embodiments are of single-core type.

Figure 13:
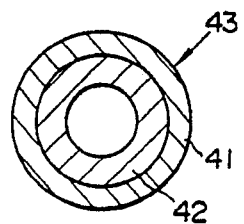
FIGS. 13 to 15 illustrate in diagrammatic cross-sectional views how to fabricate another La-Sr-Cu-O system superconducting wire according to the present invention.
Figure 14:
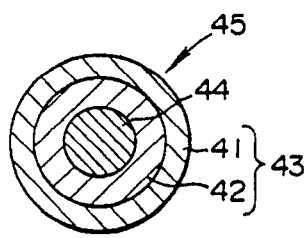
Figure 15:

FIGS. 13 to 15 show still another embodiment of the invention applied to the production of a superconducting wire of La-Sr-Cu-O system.

The production process includes preparation of a double tube 43 composed of an outer tube 41 and an inner tube 42. The outer tube 41 is made of a Cu alloy containing La as an example of the elements of group IIIa of the periodic table, while the outer tube 42 is constituted by Cu containing fine CuO particles dispersed therein.

Then, a rod 44 made of Sr as an example of alkaline earth metal is inserted into the double tube 43, whereby a composite structure 45 as shown in FIG. 14 is obtained.

Then, the composite structure 45 is subjected to a line-forming process consisting of extrusion and drawing which are known per se and the thus obtained line is subjected to a suitable mechanical process for reducing its diameter. The line-forming operation effected on the composite structure 45 is performed successfully so that a long wire is obtained without any trouble such as cutting, because the double tube 43 and the rod 44 constituting the composite structure are highly workable. The wire thus formed can be coiled without difficulty.

The wire is then heated at a temperature between 800° and 1100° C. for 1 to 100 hours, so that La, Sr, Cu and O in the wire are made to react with one another, whereby a superconducting wire 46 of La-Sr-Cu-O system is obtained as shown in FIG. 15.

In the embodiment shown in FIGS. 13 to 15, the double tube 43 is composed of the outer tube 41 made of a copper alloy containing La and an inner tube 42 made of Cu containing CuO particles dispersed therein. This, however, is not exclusive and the double tube 43 may be constituted by an outer tube 41 made of Cu containing CuO particles dispersed therein and an inner tube 42 made of a copper alloy containing La. In the described embodiment, the Cu alloy used as the material of the tube 41 contains La, while the rod 44 inserted into the double tube 43 is made of Sr which is an alkaline earth metal. This material composition, however, may be reversed such that the Cu alloy as the material of the tube 41 contains Sr, while the rod 44 is made of La which is an element of the group IIIa of the periodic table. It is also to be noted that the CuO particle may be substituted by other copper oxides, while the tube 42 made of Cu is a copper alloy tube.

In a different embodiment shown in FIGS. 16 to 21, a cylindrical ingot made of a copper alloy containing an element of the group IIIa of the periodic table is prepared by melting, through arc melting method or high-frequency induction heating. The element of the group IIIa contained in the copper alloy may be one, two or more selected from a group consisting of Sc, Y, La, Ce, Pr, Nd, Pm, Sm, Eu, Gd, Tb, Dy, Ho, Er, Tm, Yb and Lu. The ratio of content between the element or elements of the group IIIa and the copper constituting the copper alloy may be determined suitably in accordance with factors such as the composition ratio of the material of the oxide superconductor which is to be obtained as the final product.

Figure 16:
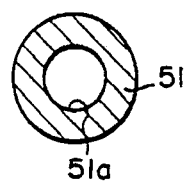
FIGS. 16 to 21 illustrate in diagrammatic cross-sectional views how to fabricate still another superconducting wire according to the present invention.

Subsequently, a through hole 51a is formed through the center of the cylindrical ingot along the length thereof by a suitable boring such as drilling, whereby a tube 51 as shown in FIG. 16 is obtained. The inside diameter of the through hole 51a is determined such that the through hole 51a can receive a later-mentioned rod.

On the other hand, another cylindrical ingot made of a copper alloy containing an alkaline earth metal element is formed by melting, through arc melting, induction heating or other suitable method. One, two or more of elements selected from a group consisting of Be, Sr, Mg, Ba and Ra is used as the alkaline earth metal mentioned above. The composition ratio between the alkaline earth metal element and copper constituting the above-mentioned copper alloy may be suitably determined in accordance with factors such as the composition ratio between copper and the IIIa group element constituting the copper alloy used as the material of the tube 51 and the composition ratio of the material of the final product of the oxide superconductor. The ingot is then subjected to a contracting mechanical processing such as swaging so that a cylindrical rod of a reduced diameter is obtained. The outside diameter of the rod is selected to be somewhat smaller than the diameter of the through hole 51a in the tube 51.

Figure 17:
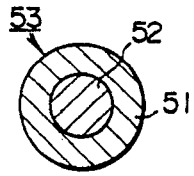
Figure 18:
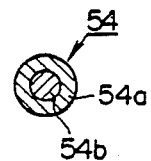

Subsequently, the rod 52 is inserted into the through hole 51a in the tube 51 as shown in FIG. 17, thus forming a composite body 53. The composite body 53 is then subjected to a series of diameter-reducing processings such as extrusion, groove roll processing, drawing and so forth, whereby a blank wire 54 of the desired diameter is obtained as shown in FIG. 18. As a result of the mechanical processings, the tube 51 and the rod 52 reduce their diameters so as to form an outer layer 54a and a core 54b of the blank wire 54.

Figure 19:
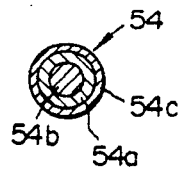
Figure 21:
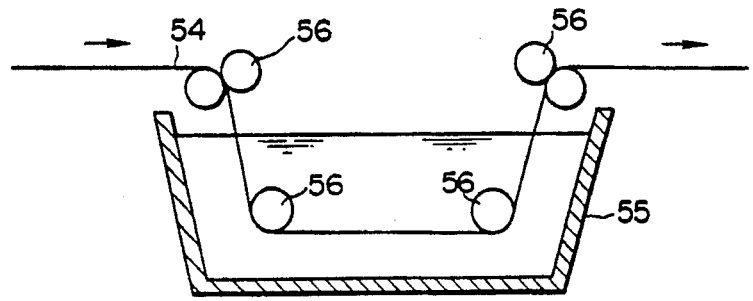

Then, an oxide layer 54c is formed on the blank wire 54 as shown in FIG. 19. The oxide layer 54c may be formed by, for example, by anode oxidation or formation. FIG. 21 illustrates an example of an apparatus for carrying out anode oxidation. The apparatus has a treating tank 55 filled with a treating bath constituted by aqueous solution of hydroxide an alkaline metal or alkaline earth metal such as NaOH, HOH, Ba(OH)$_2$, Ca(OH)$_2$ and so forth, and a plurality of rollers 56 which form a path along which the wire passes through the treating bath in the treating tank 55. In operation, the blank wire 54 mentioned above is made to pass through the treating bath in the treating tank 55 along the path formed by the rollers 56 so that an oxide layer 54c is formed on the outer periphery of the elementary wire 54 through anode oxidation. The oxide layer 54c has a thickness which can easily be controlled by varying the treating conditions such as current density and treating time in the anode oxidation.

The blank wire 54 having an oxide film thus formed thereon is subjected to heat treatment under conditions which are suitably determined in accordance with factors such as the type of the oxide superconductor. In general, however, the treating temperature ranges between 700° and 1100° C., preferably 800° and 950° C., while the treating time ranges between 1 to 300 hours, preferably several hours and 100 hours. Preferably, the heat treatment is effected in a gas atmosphere of a suitable gas such as an inert gas, e.g., argon gas or nitrogen gas, oxygen gas, chlorin gas, fluorine gas, and so forth or a mixture of one or more of these gases.

Figure 20:
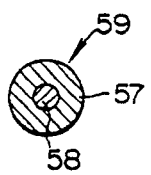

As a result of the heat treatment, oxygen and other elements in the oxide layer 54c on the elementary wire 54 are diffused into the blank wire 54 so as to react with the elements which constitute the materials of the outer layer 54a and the core 54b of the blank wire 54. In consequence, a superconductor layer 57 of oxide system is formed on the outer surface of the blank wire 54 as shown in FIG. 20, whereby an oxide superconducting wire 59 is obtained. The superconducting layer 57 formed as above has a thickness corresponding to the thickness of the oxide layer 54c on the blank wire 54. Thus, the thickness of the superconducting wire 57 can be controlled by varying the thickness of the oxide layer 54c which in turn is effected by varying the condition of, for example, anode oxidation.

It is possible to form a stabilizing layer such as of aluminum on the oxide layer 54c of the blank wire 54. In such a case, the process may be such that the oxide layer 54c is covered by an oxidation-resistant metallic coating layer made of a noble metal such as Ag, Au, Pt, Ir, Os, Pd, Rh, Ru or the like or their alloy, and the thus covered blank wire 54 is subjected to a heat treatment whereby the stabilizing layer is formed on the metallic coating layer. It is also possible to produce a superconducting wire by bundling a plurality of blank wires 54, forming oxidation-resistant metallic coating layer on the bundle, subjecting the bundle to a heat treatment and then forming the stabilizing layer thereon. The oxidation-resistant metallic layer provided between the oxide layer 54c and the stabilizing layer effectively prevents the oxygen in the oxide layer 54c from being diffused into the stabilizing layer without fail.

The embodiment described in connection with FIGS. 16 to 21 features that the tube 51 is made of a copper alloy containing an element of the group IIIa of the periodic table, while the rod 52 is made of a copper alloy containing an alkaline earth metal element. This, however, may be modified such that the tube 51 is made of a copper alloy containing an alkaline earth metal element, while the rod 52 is made of a copper alloy containing an element of the group IIIa of the periodic table. The use of anode oxidation as a method of forming the oxide layer 54c on the blank wire 54 is only illustrative and the oxide layer may be formed by a different method such as formation which employs, for example, a chromium oxide.

Figure 22:
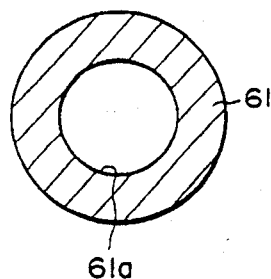
FIGS. 22 to 28 illustrate in diagrammatic cross-sectional views how to fabricate another Y-Ba-Cu-O system superconducting wire according to the present invention.

FIGS. 21 to 28 shows a different embodiment of the invention. In this case, as shown in FIG. 22, a cylindrical tube 61, referred to as a copper alloy member, is prepared from a Cu-Y alloy, as shown in FIG. 22. A through hole 61a having a circular cross-section is formed in the center of the tube 61 so as to extend along the axis of the tube 61. The Y content of the alloy used as the material of the tube 61 is suitably determined taking into consideration various factors such as the drawing workability in a subsequent diameter-reducing mechanical processing, composition of the oxide superconductor in the superconducting wire which is to be obtained as the final product, and so forth. The Y content, however, usually ranges between 5 and 20 wt %.

Figure 23:
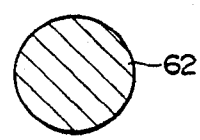

Meanwhile, a base member 62 made of Ni and having a cylindrical form as shown in FIG. 23 is prepared. This base member 62 constitutes the core of the superconducting wire as the final product. The base member 62 has an outside diameter which is smaller than the inside diameter of the through hole 61a formed in the tube 61. The use of Ni as the material of the base member 62 is only illustrative and other suitable mono-component metal or alloy can be used equally well, as the material of the base member 62. Examples of the material suitably used are mono-component metals such as noble metals e.g., Ag, At, Au, as well as Ti and Ta, and alloys such as Cu-Ni alloy, Cu-Al alloy, Ni-Al alloy, Ti-V alloy, monel metal, stainless steel and so forth.

Figure 24:
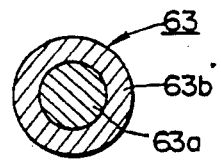

Subsequently, the base member 62 is inserted into the through hole 61a in the tube 61 so as to constitute a composite body which is then subjected to a diametrreducing mechanical processings including extrusion, drawing and so forth, whereby a sound wire having a circular cross-section is formed as shown in FIG. 24. The round wire 63 has a central core 63a of a circular cross-section formed from the base member 62 and a Y-containing copper alloy portion 63b surrounding the core 63a and formed from the tube 61.

Figure 25:
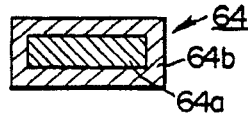

The round wire 63 thus formed is then shaped to have a rectangular cross-section as shown in FIG. 25, whereby a flat wire 64 is formed. Thus, the flat wire 64 has a core 64a having a flat rectangular cross-section formed from the circular-cross-sectioned core 63a of the round wire and a copper alloy portion 64b having a flat rectangular cross-section formed from the circular-cross-sectioned copper apply portion 63b of the round wire 63.

Figure 26:
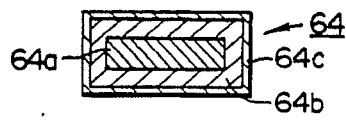

Subsequently, an oxidation treatment is effected on the surface of the copper alloy portion 64b of the flat wire 64, so that an oxide film 64c, composed of Cu$_2$O, CuO, Cu$_2$O$_3$ or the like, are formed as shown in FIG. 26. The oxidation treatment maybe effected by dipping the flat wire 64 in an aqueous solution of hydrogen peroxide or nitric acid. It is also possible to effect the oxidation through an anode oxidation process which makes use of an electrolytic bath of an aqueous solution of hydroxide os an alkaline metal or alkaline earth metal, e.g., NaOH, KOH or the like, together with ethanol, methanol, formic acid or the like as necessitated. The film thickness of the oxide film 64c is suitably determined in accordance with factors such as the thickness of the superconducting layer of the superconducting wire which is to be obtained as the final product. In general, however, the thickness of the oxide film preferably fall within the range between 1 and 2 μm. Provided that the core 64a of the flat wire 64a is made of the aforementioned anti-oxidation metallic material, there is no risk for the surface of the core 64a to be oxidized during the oxidation, whereby superior mechanical strength of the core 64a is ensured.

Figure 27:
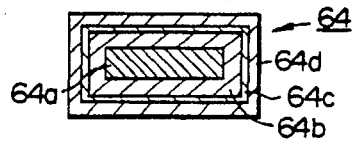

Subsequently, a material layer 64d containing a barium compound is formed on the surface of the oxide film 64c, as shown in FIG. 27. Examples of such a barium compound are halogens such as an oxide, carbonate, sulfide, chloride and fluoride, as well as their mixtures. The thickness of the material layer 64d is determined in accordance with factors such as the thickness of the superconducting wire to be obtained, though it usually falls within the range between 10 and 50 μm. The material layer 64d may be formed by any one of suitable known methods such as spray painting of a liquid suspending powder particles of the above-mentioned compound, flame spraying and various thin-film forming methods including CVD and sputtering.

Thus, the flat wire 64 now has a flat rectangular core 64a, a copper alloy portion 64b on the core 64a, an oxide film 64c overlying the copper alloy portion 64b and the material layer 64d on the oxide film 64c. The flat wire 64 is then subjected to a heat treatment which consists in heating the wire for a period of one hour to several tens of hours at a temperature ranging between 600° and 1000° C. The heat treatment is preferably conducted within an atmosphere of pure oxygen, a gaseous mixture of oxygen and an inert gas such as argon gas and nitrogen gas, and a gas which is formed by mixing, with the above-mentioned gaseous mixture, a halogen gas such as fluorine gas, chlorin gas, bromine gas and so forth.

As a result of the heat treatment, various elements in the flat wire 64 such as copper and yttrium elements in the copper alloy portion 64b, copper, yttrium and oxygen elements in the oxide film 64c and barium and oxygen elements in the material layer 64d are diffused in one another, whereby superconducting layers 65 containing a Y-Ba-Cu-O system superconductor are formed in the boundary between the copper alloy portion 64b and the oxide film 64c and the boundary between the oxide film 64c and the material layer 64d, so as to extend over the entire length of the flat wire 64.

According to the described process, a uniform and continuous superconducting layer 65 including a superconductor of Y-Ba-Cu-O system is formed in the region from the boundary between the copper alloy portion 64b and the oxide film 64c and the boundary between the oxide film 64c and the material layer 64d, whereby an elongated superconducting wire 66 having superior superconductivity is produced.

This embodiment may be modified such that the copper alloy portion 64b is constituted by a copper alloy containing at least one of elements belonging to the group IIIa of the periodic table or a copper alloy containing at least one of elements belonging to the group IIIa of the periodic table and at least one of elements belonging to the group IIa of the periodic table, while the material layer 64d is constituted by a compound of the above-mentioned at least one of elements of the group IIa or a compound containing the above-mentioned at least one of the elements of the group IIIa and the above-mentioned at least one of the elements of the group IIa of the periodic table.

In a further embodiment of the present invention, the flat wire as shown in FIG. 25 is used, as in the case of the embodiment shown in FIGS. 22 to 25.

Powder of BaO or a mixture powder of BaO and $Y_2O_3$, having a mean particle size on the order of several micron meters (μm) is sprayed onto the surface of the flat wire 64 so as to form a coating layer 75 having a thickness of several tens of micron meters (μm), whereby a coated composite body 76 is formed.

Figure 31:
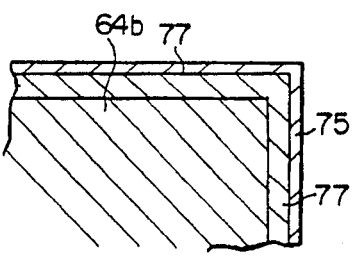

The thus obtained coated composite body 76 is subjected to a heat treatment which is conducted by heating the body 76 at 400° to 600° C. within an inert gas atmosphere such as of argon gas for a period which may be varied between one hour and several hundreds of hours. Consequently, constituent elements of the coating layer 75 and the constituent elements of the copper alloy layer 64b containing Y are mutually diffused, whereby an intermediate layer 77 composed of Y, Ba and Cu is formed in the boundary between the coating layer 75 and the copper alloy layer 64b, as shown in FIG. 31. This intermediate layer 77 is formed by mutual diffusion of the constituent elements of the copper alloy layer 64b and the constituent elements of the coating layer 75, so that the copper alloy layer 64 and the coating layer 75 are bonded and united strongly.

Figure 32:
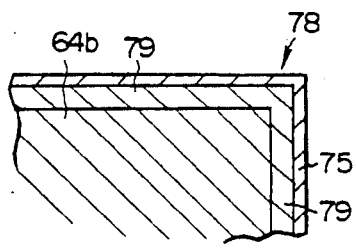

Subsequently, the coated composite body is subjected to a heat treatment consisting in 1 to 100-hourheating at 600° to 1100° C. in an oxidizing atmosphere containing oxygen gas, and cooling down to the room temperature at a rate of 100°C./hr, whereby a superconducting wire 78 having a sectional structure as shown in FIG. 32 is obtained.

Although in the preceding embodiments, La and Y are used as IIIa group elements and Sr and Ba are used as IIa group elements, superconductors according to the present invention may be fabricated at similar conditions using other IIIa and IIa group elements.

Although the multi-strand superconducting wire is illustrated only in FIG. 12, it may be fabricated in a similar manner using single superconducting wires of the other embodiments. In the embodiment of FIG. 12, bundled composite wires 35 may be inserted in a barrier pipe made of Ni, Ti or a like conventional material, and the barrier covered composite wire bundle may be inserted into a stabilizing copper tube to form a composite assembly, which may be then subjected to diameter reduction. Thereafter, the composite assembly undergoes a heat treatment for producing the superconductor in conditions similar to those in the preceding embodiments. When the stabilizer is not used, the barrier tube is omitted.

The present invention may be applied to a Bi-Sr-Ca-Cu-O system superconductor, in which case in FIGS. 1 to 4, a mixture including powders of Bi, Ca and CuO may be used in place of the mixture of powders of Cu-La and CuO.

In view of thermal stresses during the heat treatment for producing a superconductor, it is, according to the present invention, preferable to raise the temperature of the wire composite at a rate of smaller than about 100°C./hour from room temperature to the calcination temperature previously mentioned although it may be raised at a rate larger than about 300° C. On the other hand, the rate of temperature decrease from the calcination temperature to room temperature is preferably about 100° C. to 200° C. although it may be about 300° C. or higher.

When a calcined material is cooled during the heat treatment for producing the Y-Ba-Cu-O system superconductor, it may be, according to the present invention, maintained for about 5 to 48 hours in a temperature range about 400° C. to about 500° C., in which the crystal of the oxide superconductor transforms from a cubic system to a rhombic system and it may be then cooled to room temperature, so that the crystal structure is transformed to a rhombic system, which provides both a high critical temperature and a high critical current density.

EXAMPLE 1

A melt of a Cu-Y alloy containing 10 wt % of yttrium was poured into a cylindrical crucible made of CaO and the crucible was moved at a speed of 1 mm/min through a high-frequency induction coil having a length of 100 mm. In this case, the high-frequency induction heating coil was line at its inner side with a cylindrical graphite liner so that the interior of the crucible moved in the graphite liner was maintained at about 1200° C. As a result, an ingot of a Cu-Y alloy having a multiplicity of acicular Cu-Y intermetallic compound phase of about 40 to 50 $\mu m\phi$ was prepared. The ingot was then subjected to a surface grinding so that its outside diameter was reduced to 20 mm$\phi$ and the thus ground ingot was subjected to a boring whereby a Cu-Y alloy tube having the outside diameter of 20 mm$\phi$ and an inside diameter of 20 mm$\phi$ was obtained. Meanwhile, a melt of a Cu-Ba alloy containing 50 wt % of barium was sprayed within an oxygen atmosphere whereby a powder of Cu-Ba alloy oxide having particle sizes ranging between 20 and 30 $\mu m$ was prepared. The powder of Cu-Ba alloy oxide thus formed was charged in the above-mentioned Cu-Ba alloy tube, and the tube was subjected to a diameter-reducing processing including extrusion and drawing, whereby a multiplicity of wires having an outside diameter of 1.0 mm$\phi$ were obtained. Then, 91 pieces of the thus formed wires were bundled and the bundle was placed in a copper tube having an outside diameter of 13 mm$\phi$ and an inside diameter of 12 mm$\phi$. The tube was then subjected to extrusion and drawing so that a multi-core wire having an outside diameter of 1.0 mm$\phi$ was obtained. Subsequently, the multi-core wire was subjected to anode oxidation which was conducted by dipping the wire in a 20 wt. % aqueous solution of NaOH so that a surface oxidation layer having a thickness of 1 $\mu m$ was formed. The wire was then heated at 900° C. for 24 hours so as to be changed into a superconducting wire.

The long continuous superconducting wire thus formed exhibited superior superconductivity: namely, a critical temperature of 95 k and a critical current of $10^3 A/cm^2$ at 77 k under magnetic flux density of 0 (zero). In addition, a higher mechanical strength than known superconducting wire was confirmed.

EXAMPLE 2

A bar of 20 mm diameter and 200 mm long was prepared by arc melting method from a Cu-Y alloy containing 5 atomic % of Y. A through hole of 10 mm diameter was formed in the core of the bar along the longitudinal axis thereof. The tube was charged with BaO powder having particle sizes of about 1 $\mu m$ to form a composite tube so that Y, Ba, Cu and O are contained at a ratio 1:2:3:7 in it. The composite tube was subjected to a drawing, whereby a wire of about 1 mm in diameter was obtained. The thus formed wire was then heated at 800° C. for about 50 hours, whereby a superconducting wire of Y-Ba-Cu-O system was obtained. A measurement of the critical current of this superconducting wire proved that the electric resistance is reduced to zero at a temperature around 90 k.

EXAMPLE 3

A Cu-Y alloy cylindrical ingot of the same size as that in Example 2 was prepared by the same method as Example 2, and the cylindrical ingot was subjected to boring so that a tube having a bore of 10.5 mm diameter was formed.

On the other hand, a Cu=Ba alloy was prepared by induction heating melting such that the Ba content measures 10 atomic %, and a cylindrical ingot having an outside diameter of 30 mm and a length of 300 mm was produced from this alloy.

The ingot was then swaged to reduce its diameter down to 10 mm so as to become a rod. The rod was inserted into the above-mentioned tube so that a composite body was obtained. The thus obtained composite body was then processed through groove rolling and drawing, so that a blank wire having an outside diameter of 1.0 mm was obtained. Subsequently, an oxide layer having a thickness of about 10 $\mu m$ was formed by anode oxidation on the outer periphery of the blank wire. The anode oxidation was executed by using a 10% aqueous solution of NaOH. The electric current density and the treating time were about 2A/cm$^2$ and about 10 minutes, respectively.

The blank wire having the thus formed oxide layer was heat-treated at 800° C. for 50 hours within nitrogen gas atmosphere, so that the oxygen in the oxide layer on the surface of the blank wire was diffused into the blank wire, whereby the objective oxide superconducting wire was produced.

Measurement of characteristics showed that this superconducting wire have excellent critical temperature value of 90 k, while the critical current density was about $10^3 A/cm^2$ at the temperature of liquid nitrogen. It was also confirmed that this superconducting wire has a uniform superconducting characteristics along the longitudinal axis thereof.

EXAMPLE 4

A pure Ni rod having an outside diameter of 14 mm was inserted into a Cu-Y alloy (Y content being 10 wt %) having an inside diameter of 15 mm and an outside diameter of 25 mm, thus forming a composite body. The composite body was then drawn to reduce its diameter down to 1.0 mm. The thus thinned wire was then flattened so that a flat wire having a thickness of 0.5 mm and a width of 1.5 mm was obtained. Subsequently, the flat wire was anode-oxidized in a 20% aqueous solution of NaOH so that a copper oxide film of 2 $\mu m$ was formed on the surface of the copper alloy portion.

Then, BaO powder was deposited onto the surface of the oxide film by spraying so that a material layer of 10 $\mu m$ thick was formed on the surface of the oxide film.

Figure 28:
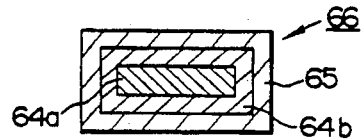
Figure 29:
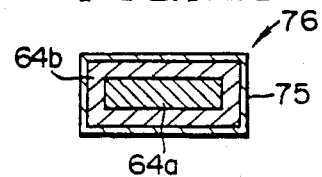
FIGS. 29 to 32 illustrate in diagrammatic cross-sectional views with modified scales how to fabricate a superconducting tape according to the present invention.
Figure 30:
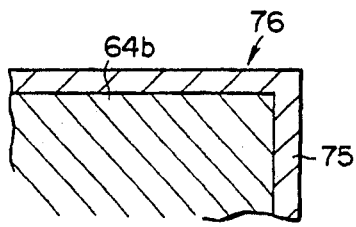

The flat wire was then subjected to a heat treatment which was conducted by placing the flat wire in an oxygen stream at 950° C. for 24 hours and was then cooled slowly down to the room temperature at a rate of 100° C./hr, whereby a superconducting wire of the structure substantially the same as that shown in FIG. 28 was obtained.

The critical temperature Tc of this superconducting wire was measured and an excellent value of Tc=95 k was confirmed. A section of this superconducting wire was examined to confirm that a superconducting layer of about 10 μm thick, composed of Y, Ba, Cu and O diffused in one another, was formed in the superconducting wire. In addition, diffraction fringe of $YBa_2Cu_3O_{9-x}$ (orthorhomic system) was observed through X-ray diffraction analysis.

EXAMPLE 5

A composite body was prepared by inserting an Ni rod having a diameter of 14 mm into a base member of a Cu-10 wt %Y alloy having outside and inside diameters of 25 mm and 15 mm. The composite body was subjected to extrusion and groove rolling so that a tape of 0.5 mm thick and 1.5 mm wide was obtained. Then, BaO powder of particles sizes not greater than 2 μm was deposited by spraying onto the tape so that a coating layer of 20 μm thick was obtained. The tape was then heated at 800° C. for 50 hours within an oxygen atmosphere, followed by a slow cooling down to the room temperature at a rate of 100° C./hr.

The thus formed oxide superconducting wire exhibited a critical temperature of 95 k which is excellent. An observation of a section of this superconducting wire proved that a reaction layer (superconducting layer) of about 10 μm was formed. It was also confirmed, through an X-ray diffraction analysis, that this reaction layer has orthorhomic system of $YBa_2Cu_3O_{9-x}$.

What is claimed is:

1. A method of producing a superconductor including an A-B-C-D system oxide superconductor wherein the A contains at least one element selected from the group consisting of Sc, Y, La, Ce, Pr, Nd, Pm, Sm, Eu, Gd, Tb, Dy, Ho, Er, Tm, Yb and Lu, the B at least one element selected from the group consisting of Be, Sr, Mg, Ca, Ba and Ra, the C copper and the D oxygen, comprising the steps of:
   (a) arranging a material containing one of said A and B inside or outside an elongated tubular layer to surround the tubular layer to form a preform, the tubular layer including an alloy of copper and the other of A and B, the material or the tubular layer including oxygen;
   (b) subsequently, reducing in thickness the preform to form a thickness reduced composite; and
   (c) heating the thickness reduced composite to produce the oxide superconductor.

2. A method as recited in claim 1, wherein the A contains Y; the B contains Ba; the tubular layer is a Cu alloy pipe ; said material containing one of A and B contains a powder of an oxide of said one of A and B; and the thickness reduced composite is heated at about 700° C. to about 1300° C. for about 1 to about 300 hours.

3. A method as recited in claim 2, wherein the superconductor includes orthorhombic $Y_1Ba_2Cu_3O_{9-x}$ where $2 < x < 3$.

4. A superconducting wire produced according to the method as recited in claim 1, 2 or 3.

5. The method of claim 1, wherein said tubular layer is a copper alloy pipe made of the alloy of copper and said other of A and B; said material containing one of A and B, contains a powder mixture of both an oxide of said one of A and B and CuO; and the arranging step (a) comprises the step of charging the powder mixture into the copper alloy pipe to form the preform.

6. The method of claim 1, wherein said tubular layer is a copper alloy pipe made of the alloy of copper and said other of A and B; said material, containing one of A and B, has a rod shape; and the arranging step (a) comprises placing a copper pipe containing oxygen, within the copper alloy pipe and inserting the rod shaped material into the copper pipe for forming the preform.

7. The method of claim 1, wherein the tubular layer is a copper alloy pipe made of the alloy of copper and at least said other of A and B; said material containing said one of A and B has a rod shape; and the arranging step (a) comprises placing the rod shaped material within the copper alloy pipe for forming the preform; and further comprising, before the heating step, coating an oxide layer over the thickness reduced composite of step (b) for supplying a sufficient amount of oxygen to produce the superconductor in heating step (c).

8. A method of producing an oxide superconductor including an A-B-C-D system oxide superconductor wherein the A contains at least one element selected from the group consisting of Sc, Y, La, Ce, Pr, Nd, Pm, Sm, Eu, Gd, Tb, Dy, Ho, Er, Tm, Yb and Lu, the B at least one element selected from the group consisting of Be, Sr, Mg, Ca, Ba and Ra, the C copper and the D oxygen, comprising the steps of:
   (a) reducing in thickness an alloy rod material made of an alloy of copper and one of A and B;
   (b) subsequently, coating the thickness reduced rod with a layer containing the other of A and B to form a composite, said layer further including oxygen in a sufficient amount to produce the oxide superconductor; and
   (c) heating the composite to produce the oxide superconductor.

9. The method of claim 9, wherein the alloy rod is in the shape of a hollow rod, the alloy rod having an anti-oxidation metallic rod as a core member fitted therein; said layer comprises a sub-layer, containing said other of A and B and an oxide film layer; the coating step (b) comprises, before the heating step (c), forming an oxide film layer over the thickness reduced rod, and coating the sub-layer over the oxide film layer; and further comprising before the thickness reducing step (a), fitting the anti-oxidation metallic rod in the hollow alloy rod.

* * * * *

UNITED STATES PATENT AND TRADEMARK OFFICE
CERTIFICATE OF CORRECTION

PATENT NO.   : 4,885,273
DATED        : Dec. 5, 1989
INVENTOR(S)  : Masaru Sugimoto, et al It is certified that error appears in the above-identified patent and that said Letters Patent is hereby corrected as shown below:

Title page:

The first inventor's name is incorrect, "Mamoru Sugimoto" should be:

--Masaru Sugimoto--

Signed and Sealed this

Fifth Day of March, 1991

Attest:

HARRY F. MANBECK, JR.

*Attesting Officer*   Commissioner of Patents and Trademarks